United States Patent [19]

Ikeda et al.

[11] 4,008,084
[45] Feb. 15, 1977

[54] METALLIC IMAGE FORMING MATERIAL

[75] Inventors: Tomoaki Ikeda; Sadaharu Ikeda; Yuzo Mizobuchi; Takeshi Tomotsu, all of Asaka, Japan

[73] Assignee: Fuji Photo Film Co., Ltd., Minami-ashigara, Japan

[22] Filed: Apr. 25, 1975

[21] Appl. No.: 571,817

[30] Foreign Application Priority Data

Apr. 25, 1974 Japan .............................. 49-46949

[52] U.S. Cl. .................................. 96/35; 96/86 P; 96/87 R; 156/665
[51] Int. Cl.$^2$ ......................................... G03C 5/00
[58] Field of Search ................. 96/3 S, 86 P, 86 R; 156/11, 22; 252/79.2, 79.5

[56] References Cited

UNITED STATES PATENTS

| | | | |
|---|---|---|---|
| 3,865,595 | 2/1975 | Watkinson | 96/7 S |
| 3,873,316 | 3/1975 | Velten | 96/7 S |

*Primary Examiner*—John D. Welsh
*Attorney, Agent, or Firm*—Sughrue, Rothwell, Mion, Zinn & Macpeak

[57] ABSTRACT

A metallic image forming article comprising a support, an intermediate layer comprising Al and a metal having an ionizing tendency lower than that of Al, and a photosensitive resin layer on the intermediate layer.

12 Claims, 5 Drawing Figures

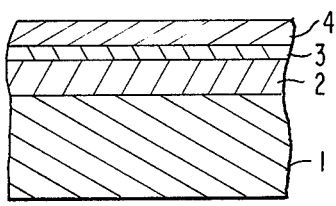
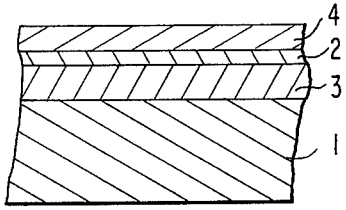
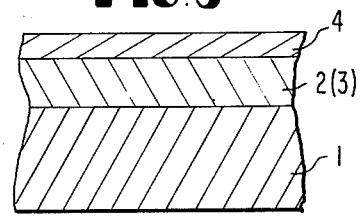
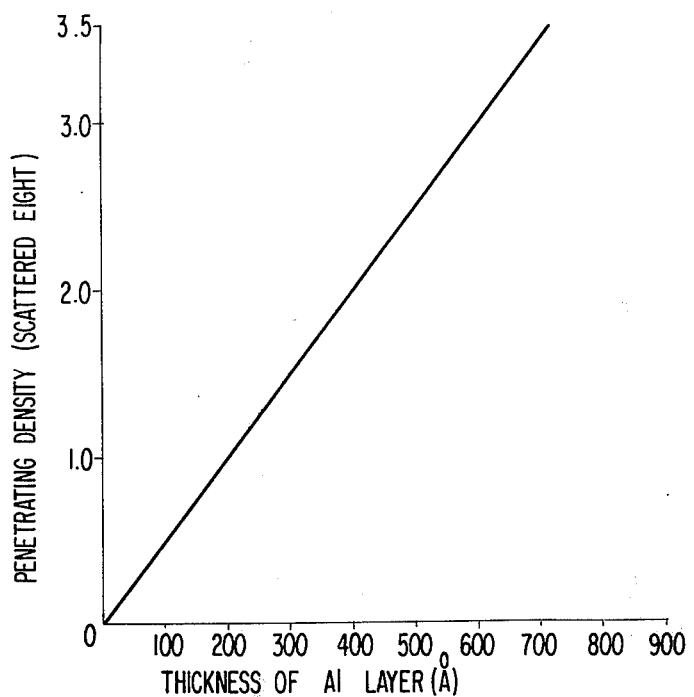
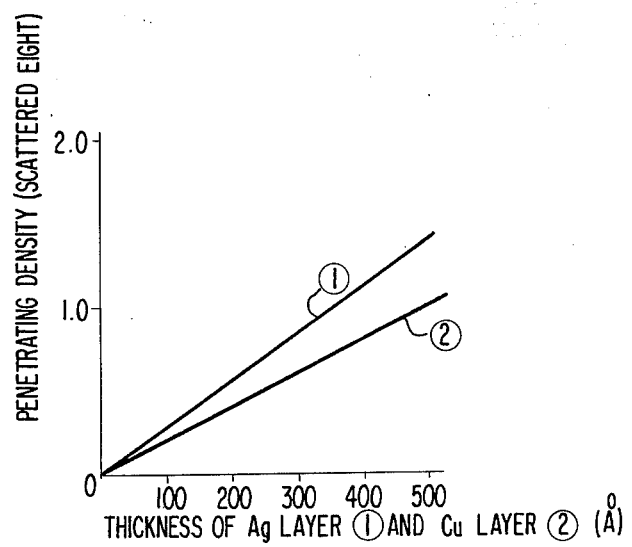

METALLIC IMAGE FORMING MATERIAL

BACKGROUND OF THE INVENTION

1. Field of the Invention

This invention relates to an article for forming a metallic image thereon, and more particularly to a metallic image forming material capable of forming a high contrast image and suitable for producing line work and half-tone dots.

2. Description of the Prior Art

The conventional "chromium mask" produced by vacuum-depositing a Cr layer on a glass sheet surface and applying thereon a photosensitive resin layer is used for making the printed base plate of an integrated circuit by exposing and developing the "chromium mask" to form a solidified and etched resist of the resin layer and to remove the Cr deposited layer. Since the image forming material is metallic Cr, the formed image is strong but the Cr layer is scarcely etched. In addition, the Cr ion dissolved in the etching solution causes environmental pollution when discharged into the environment.

The image forming material used in the process described in Japanese Patent Application (O.P.I.) Nos. 65927/73 and 65928/73, is a vacuum-deposited layer of a Te containing composition. Te is not plentiful, is a precious resource and sometimes is toxic in nature.

One preferred metal for producing an image forming layer is Al, but Al is scarcely etched by usual etching compositions, thus a long etching time is required. Accordingly, the resist material must be durable for a long time against the attack of the etching solution so that the resist is not impaired, and in addition if etching is conducted for a long period the image obtained is disordered and not sharp.

SUMMARY OF THE INVENTION

Therefore, an object of this invention is to overcome the above described defects in conventional image forming materials and provides a novel image forming material using a safe and easily etched aluminum layer.

The image forming article of this invention comprises a support, an intermediate layer comprising Al and a metal having an ionizing tendency lower than that of Al, and a photosensitive resin layer on the intermediate layer.

BRIEF DESCRIPTION OF THE DRAWINGS

FIG. 1 shows a cross sectional view of an embodiment of the image forming article according to this invention.

FIG. 2 shows a cross sectional view of another embodiment of the image forming article of this invention.

FIG. 3 shows a cross sectional view of a further embodiment of the image forming article of this invention.

FIG. 4 is a graph showing the relation between the thickness of the Al layer of the image forming article of this invention and the optical density (penetrating density due to the scattered light).

FIG. 5 is a graph showing the relation between a Ag layer or a Cu layer of the image forming article of this invention and the optical density.

DETAILED DESCRIPTION OF THE INVENTION

Referring to FIG. 1, an Al layer 2 is provided on a support 1, and a layer 3 of a metal having an ionization tendency lower than Al is further applied on the Al layer 2. A photosensitive resin layer 4 is then applied on the metal layer 3.

Referring to FIG. 2, a layer 3 of a metal having an ionization tendency lower than that of Al is first applied on the support 1, then the Al layer 2 is applied on the metal layer 3 and the photosensitive resin layer 4 is applied on the Al layer 3.

Referring to FIG. 3, an Al layer 2 containing the metal 3 which has an ionization tendency lower than that of Al is provided on the support 1, and the photosensitive resin layer 4 is applied on the Al layer 3.

Various modifications may be made, for example, by providing an underlying layer or an intermediate bonding layer between the Al layer or the metal layer and the support, or between the Al layer or the metal layer and the photosensitive layer, or by applying a protective layer on the photosensitive resin layer.

The particular structure of the Al layer is described below. The thickness of the Al layer is determined by the optical density required for the image part. Where the image is formed by lines or dots, the optical density must be relatively high (at least about 2.0). Particularly, where the metallic image forming article according to this invention is used as the mask for printing on a presensitized (PS) plate or a like printing plate, the optical density must be at least about 3.0.

Referring to FIG. 4, the relation between the thickness of the vacuum-deposited Al layer and the optical density thereof is shown to change with the conditions of the vacuum deposition. It will be understood from the FIG. 4 that an Al layer thickness of about 400 A. is required to obtain an optical density of 2.0 and an Al layer thickness of about 600 A. is required to obtain an optical density of 3.0. While the Al layer must be sufficiently thick to be suitable for use in the image forming article thus obtained, an Al layer which is too thick must be avoided since a long time is required for etching the Al layer during the image forming treatment. If the etching is applied to the Al layer for a long time, the photosensitive resin layer is often erroded by the etching solution. A suitable thickness of the aluminum layer thus ranges from about 300 A. to about 5000 A., preferably 500 to 1000 A.

Examples of metals having an ionization tendency lower than that of Al include Mn, Ga, Cr, Fe, In, Co, Ni, Pb, Sn, Sb, Bi, Cu, Ag, Zn, Cd, Pt, Pd and Au. These metals can be laminated together with the Al layer or incorporated into the Al layer.

In another embodiment, the metal can be adhered to the surface of the Al layer in the form of fine dots. Accordingly, the metal need not always be in the form of a uniform film, and can be a discontinuous layer having the desired mean thickness. A suitable thickness can range from about 3 A. to about 400 A.

The thickness of the metal layer shown in FIGS. 1 and 2 includes not only that of a true uniform film but also the means thickness of the adhered dots. Where a metal having an ionization tendency lower than Al is formed as a uniform film, the etching thereof becomes rather difficult, and, in some cases, no saving of the metal and etching solution can be achieved. In addition, a large amount of waste etching solution will cause environmental pollution.

In view of these conditions, the formation of the layer of the metal having an ionization tendency lower than Al is important. A first process for the formation of the Al layer which can be used comprises laminating a desired mask on the support and vacuum-depositing the metal on the laminate. According to this invention, an Al layer having the desired thickness is provided in or on the support, and a mesh screen made from stainless steel is laminated on the Al layer. Then, the metal having an ionization tendency lower than Al is vacuum-deposited on the laminate in a discontinuous state (not in the form of a film). The metal deposit obtained is in the form of fine islands arranged at regular and small intervals, and gives rise to favorable results.

The mechanism of the formation of the vacuum deposited film is very intricate and has not yet been fully clarified. As a result of electronic microscope inspection, the growth of the vacuum-deposited film has been found to include (i) a step of nucleus formation and growth of the nucleus into grains, (ii) a step of coalescence of the grains with each other, and (iii) a step of repetition of grain coalesence to form a continuous film. For example, according to a recent report on the relation between the thickness of an Au deposited layer and the density of the grains, the density of the grain increases until the mean film thickness reaches about 3 A. but decreases with a mean film thickness above 3 A. This phenomenon means that formation of the nucleus is dominant before the mean thickness of the Au layer reaches 3 A. and coalesence becomes dominant after the Au film thickness exceeds 3 A. On the other hand, the distribution of the size of the deposited grains is a Gaussian distribution for the film thickness, and the grain size increases as the thickness increases. Thus, the mechanism of the growth of the vacuum deposited layer from nucleus formation to coalesence of the grown grains will be understood.

For example, the size of the largest grains in an Au film having a mean thickness of 5 A. is 60 to 80 A. The distribution of the grain size is relatively uniform for a film thickness up to 30 A., but the grain size becomes highly irregular in a film having a thickness more than 100 A. The irregular grains often have a slender form, and, in some cases, the length of the grains reach 2000 to 3000 A.

In addition, some bridging structure is believed to be built up on the island structure, which exceeds the mean film thickness, in view of a fact that the electric resistance of the Ag, Cu or Al film sharply decreases in the film thickness range between 160 A. and 170 A. Generally, the relation between the mean film thickness and the island structure is affected by the types and shapes of the underlying layer, the temperature and the amount of gas absorbed by the underlying layer, the degree of vacuum during the vacuum-deposition treatment and the vacuum-deposition rate. Before the metal film thickness grows to 40 A., the metal grains are in a state of growth; where the metal film thickness ranges between 160 A. and 170 A., the metal grains are in a state of coalesence; where the metal film thickness grows to 250 A., the metal grains are formed into a network structure; and where the metal film thickness has grown to more than 400 A., the metal grains are formed into a continuous film.

Accordingly, where the mean film thickness of the metal having an ionization tendency lower than Al is the lowest but sufficient for exhibiting the above described effect, the metal layer contributes scarcely to the optical density of the image line, and the contribution is mainly carried out by the Al layer itself. As was already described above, the function of the layer of the metal having the ionization tendency lower than that of Al is to accelerate the etching rate of the Al layer. Accordingly, most preferably the function of the metal layer must be achieved with the smallest but necessary mean thickness.

The relation between the thickness of an Ag or Cu film and the optical density is shown in FIG. 5, wherein the abscisa indicates the film thickness (A.) and the ordinate indicates the penetrating density (scattered light) of the film. In FIG. 5, Line 1 shows the relation for the Ag layer and Line 2 shows the relation for the Cu layer.

Although the vacuum deposition process has been described for providing the Al layer and the layer of the metal having an ionization tendency lower than Al, it will be understood that a sputtering process, a ion plating process, an electric deposition process, an electrophoretic process, a gaseous deposition process, a spraying process and other known processes can be usefully employed in the invention. Suitable deposition techniques are described in detail in L. I. Maissel and R. Glang, *Handbook of Thin Film Technology*, McGraw-Hill, New York, (1971).

Various forms of the support on which the Al layer or the layer of the metal having an ionization tendency lower than that of Al is to be provided can be used in accordance with the use of the image forming article. Usually, the support preferably is in the form of a sheet or film, which can be opaque, transparent or translucent. In addition, the support sheet or film must not be etched by the Al etching solution and must maintain high adhesion to the layers so that the layers thereon do not peel off. The support is made from various types of materials, e.g., porcelain, amorphous glasses, crystalline glasses, metals, metal alloys, synthetic resins, and combinations thereof. If desired, the transparent or translucent support can be colored with a coloring agent, and the transparent support can be made opaque or translucent with suitable additives. Where the image forming article of this invention is applied to transmitting type members, which require the formation of an image on the support by means of the Al layer, and a transmission of the light through the etched Al layer to apply the light on the exposed zone of the support and to interrupt the image light by the Al layer, the support must be transparent. On the other hand, where the image forming article of this invention is applied to light reflecting type members, which require the image to be formed by reflected light, the support need not be transparent.

The photosensitive resin layer applied on the Al layer or the layer of the metal having an ionization tendency lower than that of Al can be formed from various known resist forming photosensitive resins. Resist forming photosensitive resins include monomers, prepolymers and polymers in which molecular structure thereof is changed chemically in a short period of time upon irradiation with active light, and the physical properties, such as the solubility in a solvent and adhesive property are also changed. The nature of the photosensitive resin has not been completely defined, but descriptions of monomers and polymers are duely contained in the concept of the photosensitive resin as described in *Industrial Techniques Library* 33: *Photosensitive Resin* Tetsuo Warashina et al., Feb. 21, 1972, published by Nikkan Kogyo Shinbun.

Photosensitive resins can be classified into two types; one of which is dissolved by a solvent during the developing treatment, and the other of which is peeled off from the support during the developing treatment.

Each type of resin can be further classified into positive and negative types. In view of the chemical reactions, the photosensitve resin can be classified into a first photo-cross linking type which crosslinks by metal ions under irradiation with active light or dimerizes by itself, a second type which cross links by the decomposition of a light decomposable material co-existing with the resin under the irradiation of active light, and a third type which polymerizes by itself under the irradiation of the active light. All these types of photosensitive resins are useful for producing the image forming article of this invention. Many resins belonging to the above classifications of photosensitive resins, are known, and essentially any photosensitive resin which has the ability to form the photoresisting film is useful for producing the image forming article of this invention.

The classification is preferably made from the standpoint of the type of the developing treatment rather than the type of chemical reaction.

The positive type of solvent dissolving layer forming photosensitive resin is decomposed by the light irradiation into a heterocyclic compound and becomes soluble in an alkali solution. Thus, the exposed part of the resin layer is removed by the developing treatment using an alkali solution and the unexposed part of the resin layer remains forming the image.

The negative type of solvent dissolving layer forming photosensitive resin is photo-cross-linked by the light irradiation in a manner similar to a cinnamoyl or diazo group containing compound, or photo-polymerized by the light irradiation in a manner similar to acrylamide or an acrylic ester, and becomes insoluble due to the macro-polymerization of the molecules and the formation of the network structure. The unexposed part of the photosensitive resin is removed by using a suitable developing solution and the insoluble and exposed part remains and forms the desired image. This solvent dissolving type resin is widely utilized for photosensitive plates, such as PS plates, wipe-on plates and photoetching resists. Photosensitive compositions predominantly used are those for a wipe on plate and for a photoetching resist.

Useful positive type photosensitive resins are 1,2-naphthoquinone-diazides; for example, 2,3,4-trioxybenzophenone-bis-naphthoquinone-1,2-diazido-5, 5-sulfonic ester as described in Japanese Patent Publication No. 18015/62, 2-naphthoquinone-1, 2-diazide-5-sulfonyloxy-hydroxy-7-naphthalene as described in Japanese Patent Publication No. 3267/62, naphthoquinone-1, 2-diazido-5-sulfanilide as described in Japanese Patent Publication No. 1954/62, and naphthoquinone-1, 2-diazido-5-sulfonic acid ester polycondensate with formaldehyde as described in Japanese Patent Publication No. 9610/70. Other commercially available positive type photosensitive resins are KPR (type 3) made by Eastman Kodak Co. Ltd, AZ-340, AZ-1350, AZ-111, AZ-119 made by Azoplate-Shipley Co. Ltd, Photozol, Photozol B, Photozol E made by Tokyo Oka Kogyo K. K., and FPPR-300, FPPR-700, FPPR-1000 made by Fuji Yakuhin Kogyo K. K.

Useful negative type photosensitive resins are diazonium salts, azide compounds, compounds containing a cinnamoyl group. Examples of diazonium salts, include paraformaldehyde condensate of p-diazo-diphenylamine, 1-diazo-4-dimethyl-aminobenzene, hydrofluoborate, 1-diazo-3-methyl-4-dimethylaniline.sulfate, 1-diazo-3-monoethylnaphthylamine as described in U.S. Pat. No. 1,762,033. Examples of azide compounds are p-phenylene bisazide, p-azidobenzophenone, 4,4'-diazidodiphenylmethane, 4,4'-diazidobenzophenone, 4-4'-diazidostilbene, 4,4'-diazidochalcon, 2,6-di-(4'-azidobenzal)cyclohexanone, 2,6-di(4'-azidobenzal)-4-methylcyclohexanone as described in U.S. Pat. Nos. 2,852,379 and 2,940,853. These azido compounds are mixed with a conventional rubber solution to form a "photosensitive rubber liquid". The rubber can be a natural rubber or a synthetic rubber, such as polyisoprene as described in U.S. Pat. Application Ser. No. 556,328 filed June 9, 1966. Examples of polymers having an azido group therein are polyazidovinyl-benzoate, polyazidovinyl-phthalate and polyvinylazidobenzacetal. These compounds are described in Japanese Patent Publication No. 28499/65 and U.S. Pat. No. 3,475,176. Vinyl cinnamate is known as a photosensitive resin having a photosensitive cinnamoyl group. Cinnamylidene acetate ester derivatives of polyvinyl alcohol are also useful for this purpose, such as polyvinyl cinnamylidene acetate, polyvinyl cinnamate, cinnamylidene acetate, and polyvinylcarboethoxymethyl carbamate cinnamylidene acetate. Other known negative type photosensitive resins are acrylamides, acrylates and resins containing an acryloyl group. Commercially available negative type photosensitive resins are KPR, KTFR, KMER produced by Eastman Kodak Co., Ltd.,); Western Wipe produced by Western Litho Plate Co. Ltd.,; Wipe-O-sensitizer produced by Litho Chemical and Supply Co. Ltd.,; E.P.P.R, OMR, TPR produced by Tokyo Oka Kogyo K. K. Negacoat, Fuji Super Resist produced by Fuji Yakuhin Kogyo K. K.; Wipedol, Resist S produced by Okamoto Kagaku Kogyo K. K.; and KY Resist produced by Yamatoya Shoten K. K.

On the other hand, various types of reins which form a peeling layer are known; one of which is the photosensitive polymer as described in Japanese Patent Publication No. 9663/63, and 15932/66, Japanese Patent Application (O.P.I.) Nos. 33623/72, 43126/73, 58909/73 and 101117/73, U.S. Pat. 3,261,686, and German Patent OLS Application 2,256,448. The mechanism of the formation of the peeling layer is such that the adhesion to the underlying layer, e.g., the Al layer on the support, the layer of the metal having an ionization tendency lower than that of Al, or the auxiliary layers is reduced or lost by the part of the photosensitive layer irradiated or not irradiated with light. Others are photosensitive monomers which are polymerized and hardened by light irradiation, and whose adhesion to the underlying layer is reduced, lost, or increased.

These photosensitive resins are usually in the form of a liquid or solid composition combined with other ingredients. The liquid composition is applied on the Al layer, the layer of the metal having an ionization tendency lower than that of Al, or the protective layer thereof, and then dried. The film composition is superimposed on the layers and adhered thereto by compression. If necessary, the film can be heated during the adhesion. The solid composition in a form other than a film is dissolved in an organic solvent and coated on the layers. The formation of a photosensitive resin layer is carried out by a usual process. For example, the coating of an extremely thin film of the photosensitive resin is carried out with a high speed rotary coater.

In using stripping type photosensitive resins, a transparent transferring film can be superimposed intimately on the photosensitive resin layer to facilitate the subsequent stripping treatment, or on the exposed photosensitive resin layer as described hereinafter.

The image forming article of this invention can be coated with the usual protective layer and an anti-halation layer, if desired.

The formation of the image on the image forming article of this invention can be carried out by exposing the image forming article through a mask or the original image pattern thereby to form a latent image in accordance with the mask, developing the image forming article to remove the easily soluble parts or to strip off the easily peelable parts, thereby dissolving and removing the image part of the underlying Al layer or the metal layer, and finally removing the part of the resin layer as the resist.

In order to expose the image forming article through the mask, as a conventional photographic exposure process, the photosensitive layer on the image forming material is exposed with light passed through a negative or positive original image pattern in a dark room.

Most photosensitive resins are very sensitive to ultraviolet light. Where ultraviolet light is intended to be used for exposure, a xenon lamp, an ultra high pressure mercury lamp, a carbon arc lamp, and a chemical lamp are useful since these lamps emit a large amount of ultraviolet light. The safety lamp used in a dark room is preferably a yellow lamp. Where the latent image is formed in the positive type photosensitive resin layer which is soluble in a solvent, the resin layer at the unexposed part remains insoluble in the solvent but that at the exposed part becomes soluble in the solvent. On the other hand, the unexposed part becomes soluble and the exposed part remains insoluble for the negative type.

Thus, the solubility of the unexposed part in a solvent becomes different from that of the exposed part in the solvent due to the formation of the latent image. Useful solvents are water, organic solvents and mixtures of water and organic solvents. Particularly preferred organic solvents are benzyl alcohol, methyl Cellosolve, ethyl Cellosolve, butyl Cellosolve and Cellosolve acetate. Additional suitable organic solvents include diethylene glycol ethyl ether, diethylene glycol methyl ether, diethylene glycol butyl ether, 3,6-dioxaoctyl acetate, isopropyl cellosolve, $\gamma$-butyrolactone, butyl lactate, ethyl lactate, acetonylacetone and diacetone alcohol. Generally, the exposed part of a positive type photosensitive resin becomes soluble in an alkali solvent, while that of a negative type photosensitive resin becomes soluble in water or an organic solvent. Accordingly, an appropriate selection of a solvent must be made for dissolving the exposed or unexposed part of the photosensitive resin in view of the solubility thereof in the particular solvent. Of course, commercial photosensitive resins can be developed with the recommended developer solution. Thus, the positive type photosensitive resin layer remains in the unexposed area, and the negative type photosensitive resin layer is hardened and remains in the exposed area, thus forming an image. On the other hand, the Al layer or the layer of the metal having an ionization tendency lower than Al is uncovered by dissolving the unexposed part of the negative type photosensitive resin, and the exposed part thereof remains undissolved to form the image.

The unexposed area of the stripping type positive photosensitive resin retains its adhesion to the underlying layer, such as the Al layer or the layer of the metal having an ionization tendency lower than that of Al, but its adhesion to the upper stripping layer is decreased, whereby a latent image is formed. On the other hand, the exposed area retains its adhesion to the upper stripping layer but its adhesion to the underlying layer is decreased.

The unexposed area of the stripping type negative photosensitive resin retains its adhesion to the layer of Al, the layer of the metal having an ionization tendency lower than that of Al or the auxiliary layer, but its adhesion to the upper stripping layer is decreased. Accordingly, the development of the latent image is carried out after the stripping layer has been peeled off from the photosensitive resin layer. Thus, the image shaped photosensitive resin layer remains on the Al layer, the layer of the metal having an ionization tendency lower than Al or the auxiliary layer thereon to form the resist.

Then, the image forming article is dipped in an Al etching solution to etch the uncovered Al or metal layer. Thus, the uncovered Al layer part is dissolved away and the support is exposed. On the other hand, the residual resin layer serves as the resist and protects the underlying Al layer from being etched, whereby an image having the desired optical density which is determined by the Al layer thickness is obtained.

The Al etching solution can be acidic or basic. The Al layer, however, is not etched by a solution of nitric acid or a like oxidizing acid whether the solution is dilute or concentrated. This is due to the fact that a film of a chemically stable oxide is formed on the Al surface, i.e., a passive state is formed on the Al surface. This oxide, however, is dissolved away by heating it together with dilute or concentrated nitric acid, thus the etching of the Al surface becomes possible.

The Al surface is stable to water and weak acids due to the insoluble $Al(OH)_3$ film thereon, but becomes soluble on adding an alkali to the water or weak acid.

In order to form a sharp edge of the resist film, uniform etching is required. In this aspect, a basic etching solution is somewhat preferred over an acidic etching solution. The above-described two-step treatment requires the step of exposing and developing the photosensitive resin to form the corrosion resistant film and the step of etching further the uncovered Al layer.

As was already described, some of the photosensitive resin can be developed by a basic solution after exposure, and such a photosensitive resin can be developed and etched in one step or in a single bath, i.e., both the formation of the corrosion resistant pattern by developing the exposed photosensitive resin and the formation of the image by etching the Al layer can be carried out in a single step.

Several image forming articles produced by vacuum-depositing an Al layer of a thickness of 600 A. on a polyethylene terephthalate film and then vacuum-depositing layers of various types of metals in a thickness of 100 A. were etched in a solution containing sodium hydroxide (1g) and water (100 ml) and in another solution containing phosphoric acid (20 ml) and water (100 ml) keeping the temperature of the etching bath at room temperature (25° C).

The results obtained are shown in the following Table.

| Metal | Mean Film Thickness (A) | Etching Time with NaOH Aq. Solution (g/100 ml)(sec) | Etching Time with H₃PO₄ Aq. Solution (g/100 ml) (sec) |
|---|---|---|---|
| — | | 75 | 615 |
| Mn | 10 | 63 | — |
| Fe | 10 | 15 | — |
| Co | 5 | 42 | — |
| Ni | 10 | 25 | 300 |
| Sb | 10 | 52 | 540 |
| Bi | 5 | 45 | 420 |
| Cu | 8 | 18 | 140 |
| Ag | 5 | 30 | 300 |
| Pd | 3 | 15 | 210 |
| Au | 3 | 25 | 240 |

It will be apparent from the results in this table that the minimum etching time of the metal coated samples is about one-fifth of the etching time of a standard sample not coated with the metal, whether a NaOH solution or a $H_3PO_4$ solution was used, i.e., the etching velocity of the former sample is five times larger than that of the latter sample. Such phenomenon may be explained by a contact etching theory, but contact etching is influenced by the value of the electric resistance of a local cell circuit, the polarization property, the area ratio of the contacting metals and the surrounding conditions.

The image forming article of this invention is produced by making full use of the contact etching theory, i.e., the metal present with a material having a lower ionization tendency tending to elute into the solution.

Since the image forming article of this invention has the desired optical density due to the presence of the Al layer and makes use of the etching of the photosensitive layer, the image obtained has high contrast and resolution. Therefore, the image forming article of this invention is suitable for a half tone dot photosensitive material which requires line work and dot etching property in, for example, a microfilm and a litho film.

The following examples are given to illustrate the invention in greater detail. Unless otherwise indicated, all parts percents, ratios and the like are by weight.

EXAMPLE 1

An Al wire as an evaporating source having a purity of 99.99% (hereinafter designated 4N) and a length of several cm. was bent and hung on a sprial filament which was made of multiple twisted wire of tungsten and arranged in the vacuum-depositing chamber and a polyethyleneterephthalate film having a thickness of 100 μ was arranged in the vaccum-depositing chamber to form a vertical cylinder surrounding the hanging Al wire at a distance of 30 cm.

Then, vacuum-deposition was carried out in a vacuum of $5 \times 10^{-5}$ torr until the monitor ("DTM-200" type; made by Thrown Co., Ltd.) indicated a deposited layer thickness of 600 A. The Al deposited film thus obtained was further subjected to a vacuum-deposition under the same conditions using an evaporating source comprising an Al coated tungsten wire containing Fe, and the vacuum-deposition was continued until the monitor indicated a mean thickness of the deposited layer of 10 A.

AZ-1350 positive type photoresist (a positive type photosensitive resin made by Azoplate-Shipley Co., Ltd. U.S.A.) was then applied on the film obtained in the dark using a whirler rotating at 5000 r.p.m., and the coating was dried. The image forming article obtained was intimately superimposed with a positive mask and exposed through the mask for 10 sec. to radiation from a 250 W super high pressure mercury light 30 cm distant from the article. The exposed article was developed using a commercial developer AZ-1350, and the image resist was formed on the photosensitive resin layer in accordance with the figure of the positive mask.

Then, the resultant film was dipped in a solution prepared by dissolving NaOH (1g) in distilled water (100 ml) for 15 sec. and the non-image part of the Al layer not covered with the resist was etched away. A favorable positive Al image having an image density of 3.0 and a resolution of 100 lines/mm. was obtained after removing the resist.

COMPARATIVE EXAMPLE

The same sample as in Example 1 was treated under the same conditions as in Example 1 except for omitting the Fe deposition step, and a metallic image was obtained. In this treatment, about 75 sec was required for etching the Al layer. This means that time required for etching the Al layer was greatly shortened in the image forming treatment.

EXAMPLE 2

The procedures of Example 1 were repeated except that the deposition of Fe in Example 1 was replaced by a deposition of Cu in Example 2. The Cu was vacuum-deposited until the monitor showed a mean thickness of the deposited layer of 8 A. Other treating conditions were the same as in Example 1. The time required for etching the Al layer was about 18 sec., and about 60 sec. of the Al etching time was saved as compared with the procedure in a comparison example conducted in the manner described above except for the deposition of the metal having an ionization tendency lower than that of aluminum. The positive image obtained in this Example exhibited an image density of 3.0 and a resolution of more than 100 lines/mm.

EXAMPLE 3

The same procedures as in Example 2 were repeated except for using an Al layer etching solution prepared by adding phosphoric acid (20 ml) to distilled water (100 ml). The time required for etching the Al layer was 140 sec. and was much shorter than the time (600 sec) of the sample used in a comparison example conducted in the same manner as described above except for the deposition of the metal having an ionization tendency lower than that of aluminum. The positive image obtained exhibited an image density of 3.0 and a resolution of more than 100 lines/mm.

EXAMPLE 4

The procedures of Example 1 were carried out except the Fe deposition in Example 1 was replaced by a Pd desposition which was carried out until the monitor indicated a mean thichness of the deposited layer of 3 A. Other processing conditions were the same as in Example 1. The time required for etching the Al layer was about 15 sec. in this Example, and about 60 sec. shorter than that of a comparison example conducted in the same manner as described above except for the deposition of the metal having an ionization tendency lower than that of aluminum. The positive image thus obtained exhibited an image density of 3.0 and a resolution of more than 100 lines/mm.

EXAMPLE 5

The procedures described in Example 4 were repeated except that the phosphoric acid aqueous solution used in Example 3 was employed in lieu of the NaOH aqueous solution. The time required for etching the Al layer was 210 sec. and about 400 sec. was saved as compared with the processing in a comparison example conducted in the same manner as described above except for the deposition of the metal having an ionization tendency lower than of aluminum. The positive image thus obtained exhibited an image density of 3.0 and a resolution of more than 100 lines/mm.

EXAMPLE 6

The procedures of Example 1 were repeated except that Ni was vacuum-deposited on the Al deposited film instead of the vacuum-deposition of Fe, and a "KPR-type 1 Negative Type Photoresist" (negative type photosensitive resin made by Eastman Kodak Co. U.S.A.) was coated on the obtained film using a whirler rotating at 3,000 r.p.m. The coated photosensitive resin was then dried to produce an image forming article. A negative mask ws superimposed intimately on the resultant image forming article, which was exposed for 30 sec. to radiation from a 100 W high pressure mercury light arranged 30 cm distant from the article. The exposed article was developed with the commercial developer "KPR-TYPE 1", and the resist of the positive image was formed on the photosensitive resin layer in accordance with the figure of the negative mask.

Then, the resultant film was dipped in the same etching solution as described in Example 1 for 25 sec., and the nonimage part of the Al layer not covered with the resist was etched away. An advantageous positive Al image was obtained after removing the resist. It turned out that the time required for etching the image forming article according to this invention was very short as compared with that of 75 sec of the image forming article in a comparison example conducted in the same manner as described above except for the deposition of the metal having an ionization tendency lower than that of aluminum.

EXAMPLE 7

The procedures of Example 6 were repeated and the same etching solution as in Example 3 was employed. The time required for etching the Al layer was about 600 sec., and was much shorter than that (about 600 sec.) of a comparison example conducted in the same manner as described above except for the deposition of the metal having an ionization tendency lower than that of aluminum.

EXAMPLE 8

The procedures of Example 1 were repeated except that the Fe deposition in Example 1 was replaced by a Bi deposition. The Bi was vacuum-deposited until the monitor showed a mean film thickness of 5 A. Other treating conditions were the same as in Example 1. The time required for etching the Al layer was about 45 sec., and about 30 sec. was saved as compared with that of the sample in a comparison example conducted in the same manner as described above except for the deposition of the metal having an ionization tendency lower that of aluminum.

EXAMPLE 9

The procedures of Example 8 were repeated except that the phosphoric acid aqueous solution used in Example 3 was used as the etching solution for the Al layer. The time required for etching the Al layer was 420 sec. and about 200 sec. was saved as compared with that of the sample in a comparison example conducted in the same manner as described above except for the deposition of the metal having an ionization tendency lower than that of aluminum. The obtained positive image exhibited an image density of 3.0 and a resolution of more than 100 lines/mm.

EXAMPLE 10

Ag was incorporated with the evaporating source made from the Al coated W having a thickness of 100 $\mu$ was arranged in the chamber set in the vacuum-depositing chamber, and a polyethyleneterephthalate film to form a vertical cylinder surrounding the evaporating source at a distance of 30 cm. The vacuum-deposition was carried out in a vacuum of $5 \times 10^{-5}$ torr until the monitor indicated a mean film thickness of 5 A. After that, an Al wire having a purity of 4 N was bent and hung on the sprial filament which was made of a multiple twisted wire of tungsten and arranged in the vacuum-depositing chamber, and Al was vacuum-deposited on the polyethyleneterephthalate film until the monitor indicated a film thickness of 600 A.

The film thus obtained was coated with a photosensitive resin layer in the same manner as in Example 6, and the resultant image forming article was exposed and developed. The developed article was etched using the same etching solution as used in Example 1, and an advantageous negative image was obtained. The time required for etching the Al layer was 30 sec., and about 40 sec. was saved as compared with that of a comparative example conducted in the same manner as described above except for the deposition of the metal having an ionization tendency lower than that of aluminum. The image density and the resolution of the negative image obtained were 3.0 and more than 100 lines/mm., respectively.

EXAMPLE 11

The procedures of Example 10 were repeated except that the same etching solution for the Al layer as in Example 3 was employed. The time required for etching the Al layer was about 250 sec., and about 350 sec. was saved as compared with that of a comparison example conducted in the same manner as described above except for the deposition of the metal having an ionization tendency lower than that of aluminum.

EXAMPLE 12

An Al wire of a purity of 4 N was bent and a spiral filament which was made of a multiple twisted wire of tungsten were arranged in a vacuum deposition chamber, along with a Ag coated tungsten evaporating source. A polyethylene terephthalate film having a thickness of 100 $\mu$ was arranged in the vacuum deposition chamber to form a vertical cylinder surrounding the evaporating source with a distance of about 30 cm. The vacuum-deposition was carried out in a vacuum of $5 \times 10^{-5}$ torr until the monitor showed a deposited film thickness of 650 A. In this procedure, the heating conditions which brought out a deposited Al layer of 600 A or a deposited Ag layer of 5 A in the same period of time were preliminarily determined, and the heating conditions were applied to the vacuum-deposition treatment for 1 min. Therefore, the deposited film would contain both the amount of Al corresponding to a thickness of 600 A. and the amount of Ag corresponding to a thickness of 5 A.

The Ag containing Al deposited film thus obtained was coated with a photosensitive solution made by dissolving a phenol resin and orthoquinone diazide in methyl ethyl ketone by using a whirler rotating at 4000 r.p.m. Then, the coated photosensitive solution was dried to obtain an image forming article. A positive mask was superposed intimately on the image forming article, and exposed for 5 sec. to radiation from a 250 W super high pressure mercury light 30 cm distant from the article. Then, the exposed article was treated with a solution containing sodium hypochlorite solution (effective chlorine 5% by weight) (60 ml), distilled water 400 ml and NaOH (0.6g) and an advantageous positive image was obtained. The treating time was 20 sec. and about 50 sec. was saved as compared with a comparison example conducted in the same manner as described above except for the deposition of the metal having an ionization tendency lower than that of aluminum. The image density obtained was 3.0 and the resolution was 100 lines/mm.

While this invention has been described in detail and with reference to particular embodiments thereof, numerous modifications may be made by those skilled in the art without departing from the spirit and scope of the invention. Therefore, the appended claims are intended to cover all such equivalent variations as coming within the true spirit and scope of the invention.

What is claimed is:

1. A metallic image forming article comprising a support, an intermediate layer comprising aluminum and a metal having a ionization tendency lower than that of aluminum, and an photosensitive resin layer on the intermediate layer.

2. The metallic image forming article of claim 1, wherein said intermediate layer containing aluminum and said metal having an ionization tendency lower than that of aluminum comprises an aluminum layer on said support and a layer of said metal having an ionization tendency lower than aluminum on said aluminum layer.

3. The metallic image forming article of claim 1, wherein said intermediate layer containing aluminum and said metal containing an ionization tendency lower than that of aluminum comprises a layer of said metal having an ionization tendency lower than that of aluminum on said support and an aluminum layer on the layer of said metal having an ionization tendency lower than that of aluminum.

4. The metallic image forming article of claim 1, wherein said intermediate layer containing aluminum and said metal having an ionization tendency lower than that of aluminum comprises an aluminum layer containing therein said metal which has an ionization tendency lower than that of aluminum.

5. The metallic image forming article of claim 1, wherein the thickness of the aluminum layer is such that the optical density achieved is at least about 2.

6. The metallic image forming article of claim 5, wherein the thickness of the aluminum layer is such that the optical density is at least about 3.

7. The metallic image forming article of claim 6, wherein said metal having an ionization tendency lower than that of aluminum is manganese, gallium, chromium, iron, indium, cobalt, nickel, lead, tin, antimony, bismuth, copper, silver, cadmium, zinc, platinum, palladium or gold.

8. The metallic image forming article of claim 1, wherein said support is opaque, transparent or translucent and is in the form of a sheet or film.

9. The metallic image forming article of claim 1, wherein said support is a support of porcelain, an amorphous glass, a crystalline glass, a metal, a metal alloy, a synthetic resin, or a combination thereof.

10. The metallic image forming article of claim 1, wherein said photosensitive resin layer is a layer of a positive type photosensitive resin or a negative type photosensitive resin.

11. The metallic image forming article of claim 1, wherein said photosensitive resin layer comprises a layer of a photo-cross linkable photosensitive resin, a photo-decomposable cross linking resin or a photopolymerizable photosensitive resin.

12. A method of forming a metallic image comprising imagewise exposing the metallic image forming article of claim 1 to active light thereby to form a latent image in accordance with the image-wise exposure, developing said exposed metallic image forming article to remove the easily soluble parts or to strip off the easily peelable parts, thereby dissolving and removing the image part of the underlying aluminum layer or the metal and removing the photosensitive resin layer.

* * * * *